United States Patent [19]

Van Der Laak et al.

[11] Patent Number: 4,864,120

[45] Date of Patent: Sep. 5, 1989

[54] ELECTRONIC CORRECTION OF PHOTODIODE RADIANT SENSITIVITY

[75] Inventors: Henricus J. M. Van Der Laak; Theodoor H. Enzlin, both of Eindhoven, Netherlands

[73] Assignee: U.S. Philips Corporation, New York, N.Y.

[21] Appl. No.: 264,753

[22] Filed: Oct. 31, 1988

[30] Foreign Application Priority Data

Nov. 2, 1987 [NL] Netherlands .................. 8702608

[51] Int. Cl.$^4$ ............................................. H01J 40/14
[52] U.S. Cl. ............................. 250/214 A; 250/209; 250/214 C
[58] Field of Search ............... 250/214 A, 214 R, 208, 250/209, 214 C; 307/310, 311, 491

[56] References Cited

U.S. PATENT DOCUMENTS 4,730,128  3/1988  Seki ................................. 250/214 C Primary Examiner—David C. Nelms
Assistant Examiner—William L. Oen
Attorney, Agent, or Firm—Algy Tamoshunas; Marianne R. Rich

[57] ABSTRACT

A circuit comprising a semiconductor photodiode with a first and a second terminal and an internal series resistor, including an amplifier with a first input, a second input and an output, the first photodiode terminal being connected to the first amplifier input, the second photodiode terminal being connected to the second amplifier input and a negative feedback being inserted between the output of the amplifier and its first input, characterized in that a coupling is introduced between the output and the second input of the amplifier, by means of which a voltage is generated between the second input of the amplifier and the second terminal of the photodiode, this voltage being oppositely equal to the product of the internal series resistance and the signal current flowing through the resistor.

3 Claims, 1 Drawing Sheet

ELECTRONIC CORRECTION OF PHOTODIODE RADIANT SENSITIVITY

The invention relates to a circuit comprising a semiconductor photodiode with a first and a second terminal and an internal series resistor, including an amplifier with a first input, a second input and an output, the first photodiode terminal being connected to the first amplifier input, the second photodiode terminal being connected to the second amplifier input and a negative feedback being inserted between the amplifier output and its first input. Semiconductor photodiodes are electric light-sensitive diodes. These photodiodes supply an electric signal current which is a measure for the amount of incident light power. Many photodiodes used are, for example, Germanium and InGaAs photodiodes, which are used in light power measuring equipment for the range of 800-1800 nm situated near the infrared zone and in optical transmission systems. For these applications there is required a linear relation between the incident light power and the signal or photo-electric current at the terminals of the photodiode. Especially for the said Germanium and InGaAs photodiodes this is not the case. This is caused by the large diffusion dark current. This dark current operates oppositely to the signal current. At a constant signal current the diffusion dark current rapidly increases with the dimensions of the active area of the photodiode and with the raising of the temperature. The condition of the signal current being no more than a fraction of the diffusion dark current is rapidly obtained, due to which the photodiode no longer operates linearly.

A circuit of the above type is described, for example, in Germanium Photodiode Application Note #50 by Judson. A first terminal of the photodiode is connected to a first input of an amplifier. A second terminal of the photodiode and the second input of the amplifier are connected to a point of fixed potential. Between the output of the amplifier and its first input a negative feedback is inserted. By means of the negative feedback a very low input impedance of the amplifier is realized, due to which the voltage between the first terminal and the second terminal to the photodiode is substantially equal to 0. Hereby the short-circuit current of a diode is converted into an output voltage which is rather linear over a large area.

A disadvantage of the said circuit is the fact that the voltage between the first and the second terminal of the photodiode is substantially equal to 0, true enough, but the voltage across the internal diode itself is unequal to 0V as a result of the occurring internal series resistance of the photodiode. This makes this circuit less suitable for use in, for example, optical transmission systems, where heavy demands are made on the tracking error of the semiconductor laser. The tracking error is then a measurement for the variation of the quotient of the light power radiated by the laser and the current of an incorporated monitor photodiode over a large temperature range.

The invention has for its object to provide a circuit comprising a semiconductor photodiode, the relation between the short-circuit current of the diode and the output voltage of the amplifier being very linear over a very large area and the effect of the temperature being reduced drastically. The invention is characterized in that a coupling is introduced between the output and the second input of the amplifier, by means of which a voltage is generated between the second input of the amplifier and the second terminal of the photodiode, this voltage being oppositely equal to the product of the internal series resistance and the signal current flowing through the resistor.

The invention will now be described with reference to the drawing in which.

Figure 1:
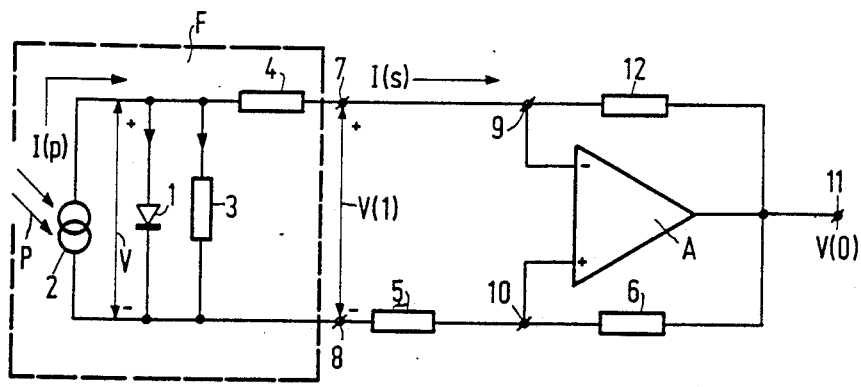
FIG. 1 shows an embodiment of the circuit in accordance with the invention.

In the circuit as shown in FIG. 1 an F denotes a semiconductor photodiode, comprising a first terminal 7 and a second terminal 8. The first terminal 7 of the photodiode F is connected to the first input 9 of the amplifier A. The second terminal 8 of the photodiode F is connected to the second input 10 of the amplifier A via a first resistor 5. Between the second input 10 and the output 11 of the amplifier A a second resistor 6 is inserted. Between the first input 9 and the output 11 of the amplifier A a third resistor 12 is inserted. Without entering into the semiconductor physics the photodiode F can be represented as a current source 2, supplying a current I(p) which is proportional to the incident light power P. Arranged in parallel with the current source 2 are the internal pn-junction 1 and the parallel resistor 3. Between the current source 2 and the first terminal 7 a series resistor 4 is inserted.

When an impressed voltage V(1) occurs between the terminals 7 and 8 of the photodiode F, a current I(s) will start flowing, depending on the incident light power P. This current I(s), however, differs from the photo-electric current I(p) generated by the current source, because currents are leaking across the internal junction 1 and across the parallel resistor 3, as shown by means of arrows. The driving force behind these leakage currents is the built-up internal voltage V across the current source 2. The leakage currents are strongly temperature dependent while the internal pn-junction 1 has a strong non-linear current-voltage characteristic. If the internal voltage V is equal to zero Volts, the driving force behind these leakage currents has ceased to exist, owing to which these currents are eliminated too. In this situation it is achieved that the photo-electric current I(p) is completely made available to the terminals 7 and 8 of the photodiode F, so I(a)=I(p). Thus the photodiode F supplies a current I(s), which is linearly proportional to the incident light power P. Consequently, the shape, the temperature and exposure dependence of and the variation in the current-voltage characteristics of the shunt elements 1 and 3 have become totally irrelevant.

In the circuit as shown in FIG. 1 the internal voltage V=0V, if the voltage drop across a first resistor 5 is oppositely equal to the voltage drop across the internal series resistor 4 of the photodiode F. A simple calculation shows that this condition is met if the following holds:

$$R/R_3 = R_1/R_2 \tag{1}$$

in which R is the resistance of resistor 4, $R_1$ is the resistance of the first resistor 5, $R_2$ is the resistance of the second resistor 6 and $R_3$ is the resistance of the third resistor 12.

Figure 2A:
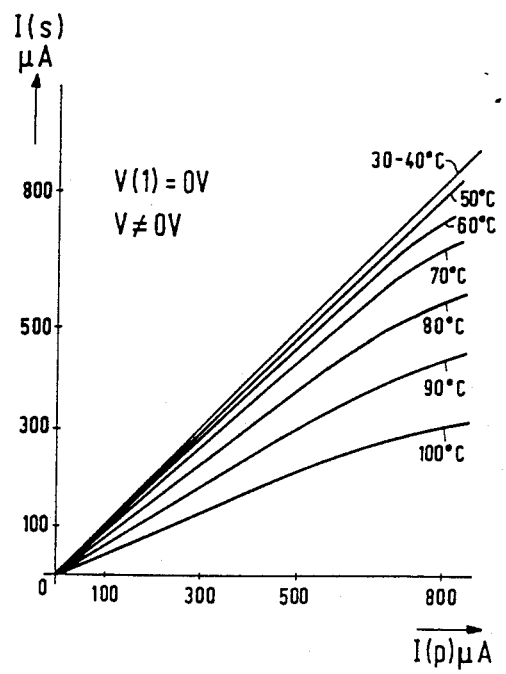
FIG. 2 shows graphs to illustrate the effect according to the invention.
Figure 2B:
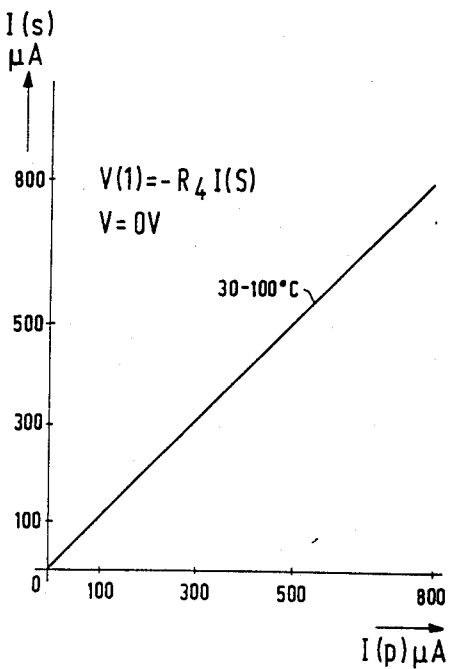

FIG. 2a shows the signal current I(s) plotted against the photo-electric current I(p), the external applied voltage V(1) being equal to 0V (photo amperic mode). Although the individual curves are substantially straight lines with a drive to a limited voltage, with a rising temperature the signal current will drop as a result of the increasing internal leak. FIG. 2b shows the signal current I(s) plotted against the photo-electric current I(p). In the circuit according to FIG. 1 there has been a correction for an internal series resistance of the photodiode F of 7.35 Q. Now the characteristics coincide over a measured temperature range of 30°–100° C. whilst linearity has improved too.

What is claimed is:

1. A circuit comprising a semiconductor photodiode with a first and a second terminal and an internal series resistor, including an amplifier with a first input, a second input and an output, the first photodiode terminal being connected to the first amplifier input, the second photodiode terminal being connected to the second amplifier input and a negative feedback being inserted between the amplifier output and its first input, characterized in that a coupling is introduced between the output and the second input of the amplifier, by means of which a voltage is generated between the second input of the amplifier and the second terminal of the photodiode, this voltage being oppositely equal to the product of the internal series resistance and the signal current flowing through the resistor.

2. A circuit as claimed in claim 1, characterized in that a first resistor is inserted between the terminal of the photodiode and the second input of the amplifier, in that a second resistor is inserted between the second input of the amplifier and its output and in that a third resistor is inserted between the first input of the amplifier and its output.

3. A circuit as claimed in claim 2, characterized in that the quotient of the resistance of the internal series resistor and the third resistor is equal to the quotient of the resistances of the first resistor and the second resistor.

* * * * *